United States Patent

Johnson

[15] 3,681,703

[45] Aug. 1, 1972

[54] LOW LEVEL DC AMPLIFIER WITH AUTOMATIC ZERO OFFSET ADJUSTMENT

[72] Inventor: David August Johnson, Hudson, Mass.

[73] Assignee: RCA Corporation

[22] Filed: Nov. 16, 1970

[21] Appl. No.: 89,668

[52] U.S. Cl.........................330/9, 330/30 D, 330/51, 330/149

[51] Int. Cl.................................................H03f 1/02

[58] Field of Search..........330/9, 11, 30 R, 30 D, 69, 330/51, 149

[56] References Cited

UNITED STATES PATENTS 2,970,276 1/1961 Dollinger..........................330/9

*Primary Examiner*—Roy Lake
*Assistant Examiner*—James B. Mullins
*Attorney*—H. Christoffersen

[57] ABSTRACT

A low level dc amplifier which amplifies low level signals and automatically adjusts the output signal thereof to eliminate the output offset voltage.

7 Claims, 2 Drawing Figures

Inventor:
DAVID AUGUST JOHNSON
BY J. Donald Weber Jr.
Attorney

LOW LEVEL DC AMPLIFIER WITH AUTOMATIC ZERO OFFSET ADJUSTMENT

BACKGROUND OF THE INVENTION

In many "on-line" automatic monitoring systems, it is frequently necessary and/or desirable to amplify a low level signal. Typically, such a low level signal may be on the order of 0 to 5 millivolts. In order to be compatible with other circuitry, a signal on the order of 0 to 5 volts may be required. Obviously, the input signal must be amplified. However, mere amplification of an input analog signal by an operational amplifier or the like is likely to produce a high output offset voltage. The standard adjustment would be by means of an adjustable circuit component, such as a potentiometer or the like, which would "null" the offset voltage. However, in many applications, especially in the present day integrated and hybridized circuit applications, it is either impossible or impractical to utilize a separate adjustment component. Consequently, a special compensation circuit or offset voltage eliminating circuit is required.

SUMMARY OF THE INVENTION

In an embodiment of this invention, a standard amplifier network is utilized to amplify the input signal. In addition, a sample and hold amplifier is selectively connected to the amplifier concurrent with a shorting of the amplifier input whereby a signal representative of the offset voltage produced by the amplifier is detected by the sample and hold amplifier.

The output of the sample and hold amplifier is compared with the output signal produced by the amplifier (without shorted input terminals) so that an output signal representative of the difference between the offset voltage and the total signal produced by the amplifier is provided. This output signal is representative of the actual output signal for the circuit minus the offset voltage introduced by the amplifier.

DESCRIPTION OF THE PREFERRED EMBODIMENT

Figures 1, 2:
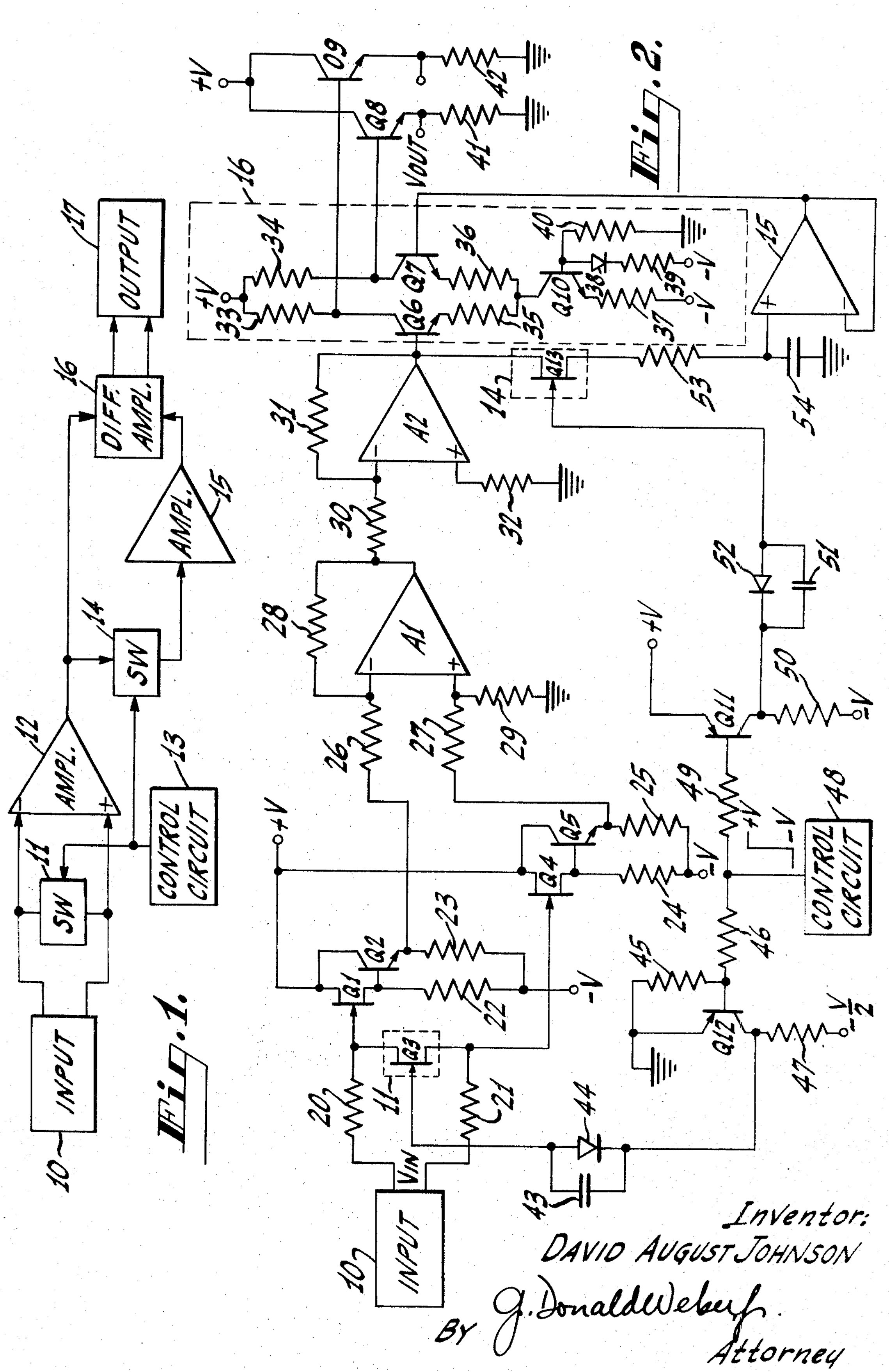
FIG. 1 is a block diagram of an embodiment of the instant invention.
FIG. 2 is a schematic diagram of a preferred circuit embodiment of the invention.

In each of the Figures, common elements bear common reference numerals.

Referring now to FIG. 1, there is shown an input device 10 which may be any suitable input apparatus. Input device 10 normally supplies a signal which is representative of the operation of the input device. In a typical example, the input apparatus may be a process controller or the like. The representative signal may be an analog signal on the order of 0 to ± 5 millivolts. This signal is applied to the input of amplifier 12. Typically, amplifier 12 is a double-ended input amplifier having high input impedance.

Switch 11 is connected between the input terminals of amplifier 11 and selectively short circuits these terminals. The output of amplifier 12 is connected via switch 14 to the input of sample and hold amplifier 15. Switches 11 and 14 are connected to and controlled by control circuit 13. The outputs of amplifier 12 and sample and hold amplifier 15 are connected to the inputs of differential amplifier 16. Differential amplifier 16 operates upon the input signals and produces an output signal representative thereof. The output of differential amplifier 16 is connected to a suitable output device or utilization means 17.

In operation, an analog signal is continuously supplied by input 10 to the input of amplifier 12. Amplifier 12 normally amplifies the signal applied to the input thereof and supplies the amplified signal at the output terminal thereof. However, as noted, amplifier 12 may produce a significant offset voltage. Since this offset voltage would produce an error at the output device, it should be eliminated. To effect the elimination of this offset voltage, a control circuit 13 is connected to supply periodic pulses to switches 11 and 14. The application of the control signal causes switches 11 and 14 to be conductive. Thus, the inputs of amplifier 12 are shorted (by switch 11), and the output of amplifier 12 is connected to an input of sample and hold amplifier 15 (via switch 14).

Obviously, when the input terminals of amplifier 12 are shorted, the output signal produced by amplifier 12 is the offset voltage. This voltage signal is applied via switch 14 to sample and hold amplifier 15 which samples and stores the signal representative of the offset voltage. The signal produced by amplifier 15 is applied to differential amplifier 16.

Concurrently, the offset voltage produced at the output of amplifier 12 is supplied to another input of differential amplifier 16. Inasmuch as the offset voltage is supplied to both inputs of differential amplifier 16, the output produced thereby, and supplied to output device 17, is 0. Consequently, output device 17 receives no signal during that portion of the operation when the offset voltage of amplifier 12 is being sampled.

Upon termination of the control signal from control circuit 13, switches 11 and 14 are rendered nonconductive. Thus, the input signal supplied by input device 10 is applied across the input terminals of amplifier 12. Amplifier 12 operates upon the input signal to produce an amplified version thereof at the output of the amplifier. This signal is supplied to one input of differential amplifier 16. Since switch 14 has been disconnected, the signal supplied to the other terminal of differential amplifier 16 is the previously stored offset voltage at amplifier 15. Differential amplifier 16 now produces an output signal which is a function of the difference between the signals supplied thereto. Since the signals supplied to differential amplifier 16 are the signals supplied by amplifier 12 (including 0 offset voltage) and the offset voltage produced by amplifier 12 and stored in sample and hold amplifier 15, the output signal produced by differential amplifier 16 and supplied to output device 17 is representative of the amplified version of the input signal alone, i.e. without offset error.

Referring now to FIG. 2, there is shown a schematic diagram of a preferred embodiment of an invention. Input 10 is connected via coupling resistors 20 and 21 to the gate electrodes of field effect transistors Q1 and Q4 respectively. The source electrodes of the field effect transistors (FET) are connected to a suitable source +V. The drain electrode of FET Q1 is connected to a reference source −V via resistor 22. Similarly, the drain electrode of FET Q4 is connected to source −V via resistor 24. The base of NPN transistor Q2 is connected to the drain electrode of FET Q1. In addition, the collector of transistor Q2 is connected to the +V source. The emitter of transistor Q2 is connected to the −V source via resistor 23. Furthermore, the emitter of transistor Q2 is connected to the inverting input of amplifier A1 via coupling resistor 26.

The base electrode of NPN transistor Q5 is connected to the drain electrode of FET Q4. The collector of transistor Q5 is connected to the +V source while the emitter thereof is connected to the −V source via resistor 25. The emitter of transistor Q5 is further connected to the noninverting input of amplifier A1 via coupling resistor 27. The noninverting input of amplifier A1 is returned to ground via resistor 29. The output of amplifier A1 is connected to the inverting input thereof by feedback resistor 28. The relationship of resistors 26, 27, 28 and 29 determines the stability and amplification of amplifier A1.

The output of amplifier A1 is also connected via coupling resistor 30 to the inverting input of amplifier A2. The noninverting input of amplifier A2 is connected to ground via resistor 32. The output of amplifier A2 is connected to the inverting input thereof via feedback resistor 31. Again, the relationship of resistors 30, 31 and 32 controls the gain and stability of amplifier A2.

The output of amplifier A2 is further connected to the base of NPN transistor Q6 which is one portion of differential amplifier 16. Transistor Q7 forms the other portion of differential amplifier 16. The collectors of transistors Q6 and Q7 are connected to a common source +V via resistors 33 and 34, respectively. The emitters of transistors Q6 and Q7 are connected to the collector of transistor Q10 via resistors 35 and 36, respectively. The emitter of transistor Q10 is connected to a source −V via resistor 37. The base of transistor Q10 is connected to ground by a resistor 40 and to the −V source via diode 38 and resistor 39. This latter network provides a tempterature compensated, constant current source for the differential amplifier.

The collectors of transistors Q6 and Q7 are further connected to the base electrodes of emitter followers transistors Q9 and Q8, respectively. The collectors of transistors Q8 and Q9 are connected to the +V source. The emitters of transistors Q8 and Q9 are connected to ground via resistors 41 and 42, respectively. In addition, the output signal $V_{OUT}$ is detected between the emitters of transistors Q8 and Q9.

Switch 11 comprises FET Q3. The source and drain electrodes of FET Q3 are connected to the gate electrodes of FET Q1 and Q4, respectively. The gate electrode of FET Q3 is connected to the parallel combination comprising diode 44 and speed-up capacitor 43. The other end of the parallel combination is connected to the collector of PNP transistor Q12, which is further connected to source −V/2 via resistor 47. The emitter of transistor Q12 is connected to ground while the base of transistor Q12 is connected to ground via bias resistor 45. Coupling resistor 46 is connected from the base of transistor Q12 to control circuit 48 to receive the control signal therefrom.

In addition, logic control circuit 48 is connected to the base of transistor Q11 via coupling resistor 49. The emitter of transistor Q11 is connected to source +V, while the collector of transistor Q11 is connected to source −V via resistor 50. In addition, the collector electrode of transistor Q11 is connected via a parallel combination comprising diode 52 and capacitor 51 to the gate electrode of FET Q13 which represents switch 14. The source electrode of FET Q13 is connected to the output of amplifier A2 while the drain electrode is connected to the noninverting input of amplifier 15 via resistor 53. The noninverting input of amplifier 15 is further connected to ground via capacitor 54. The output of amplifier 15 is returned to the inverting input thereof as well as being connected to the base of transistor Q7 in the differential amplifier 16.

In operation, it is initially assumed that control circuit 48 produces a relatively negative output signal. This relatively negative signal is applied to the base electrode of transistors Q11 and Q12. A negative signal at the base of transistors Q11 and Q12 causes conduction thereby. When transistor Q11 is conductive, diode 52 is essentially reverse-biased whereby transistor FET Q13 is rendered conductive. Consequently, the output of amplifier A2 is connected via resistor 53 across input capacitor 54 of sample and hold amplifier 15.

Concurrently, the relatively negative signal at the base of transistor Q12 causes conduction thereby such that diode 44 is essentially reverse biased whereby FET Q3 is rendered conductive. When FET Q3 is rendered conductive, the input to amplifier A1 is essentially short-circuited. Consequently, the output supplied by amplifier A1 and amplifier A2 is equivalent to the net offset voltage produced by these amplifiers in the normal operation thereof. The offset voltage is applied to sample and hold amplifier 15 as well as to the base of transistor Q6. Sample and hold amplifier 15 supplies a signal to the base of transistor Q7 which signal is substantially identical to the signal supplied to transistor Q6. Consequently, the differential output produced by transistors Q6 and Q7, and supplied to emitter followers Q8 and Q9 is substantially 0.

If, now, it is assumed that the signal supplied by control circuit 48 switches from the relatively negative to the relatively positive level, transistors Q11 and Q12 are rendered nonconductive whereby diodes 52 and 44, respectively, are rendered forward biased and conductive. As a result, FETS Q3 and Q13 are rendered nonconductive. Consequently, the input terminals associated with the amplifier network are not shorted and the output from amplifier A2 is not connected to the input of sample and hold amplifier 15. However, it should be noted that the circuitry associated with the sample and hold amplifier 15, including input capacitor 54, is so designed that sample and hold amplifier 15 will produce a signal representative of the offset voltage which is initially applied thereto, for a duration which is prescribed to be much longer than the sampling rate which is controlled by control circuit 48. More specifically, in a preferred embodiment, the sample and hold amplifier circuit will detect and hod the offset voltage supplied by amplifier A2 to within about 99 percent of its initial value for a 1 millisecond duration. Obviously, by appropriate circuit design the sample and hold duration can be adjusted as desired.

When FET Q3 is nonconductive, the analog input signal supplied by source 10 is applied to the gate electrodes of FET Q1 and Q4, respectively. This operation causes further operation of transistors Q2 and Q5 which conduct as a function of the operation of FET Q1 and Q4. The signals produced by transistors Q2 and Q5 are applied to the input of amplifier A1 which operates on the signals to amplify and shift the level thereof (in the event of a bipolar input signal from input device 10). Amplifier A1 is connected to amplifier A2 whereby additional amplification of the input signal can be accomplished. In a preferred embodiment, amplifiers A1 and A2, which may be any suitable type of dc amplifiers, provide a gain of 60 dB.

The highly amplified signal supplied by amplifiers A1 and A2 is supplied to the base of transistor Q6. The offset voltage signal supplied by amplifier 15 is continued at the base of transistor Q7. Transistors Q6 and Q7 will, normally, conduct at different rates since the signals applied to the bases thereof are different. As suggested supra, the signal applied to base of transistor Q7 is the offset voltage produced by the amplifier circuit while the signal supplied to the base of transistor Q6 is the combination of the amplified input signal plus the offset voltage produced by the amplifier network. The differential output produced by differential amplifier 16 represents the difference between the total amplified voltage plus the offset voltage minus the offset voltage. Consequently, the net output signal supplied to emitter follower transistors Q8 and Q9 is representative of the amplified input signal only. Therefore, the output voltage $V_{OUT}$ is representative of the amplified input voltage and the offset voltage inherently produced by the amplifier network is eliminated.

Thus, it is seen that there is provided a circuit which permits selective sampling of the signal which is to be monitored. The circuit lends itself to integration or hybridizing and provides a 0 offset voltage without requiring adjustable components in the circuit. Furthermore, this circuit permits all solid state construction with adjustment of an output voltage within very close tolerances. Obviously, minor changes can be made to the circuit such as reversing polarity and the like. However, any changes of this nature are intended to be included in the foregoing description and to be part of the invention as described in the appended claims.

What is claimed is:

1. In combination, first amplifier means having at least one input terminal for receiving an input signal and an output terminal, second amplifier means comprising a sample and hold amplifier having at least one input terminal for receiving an input signal and an output terminal, differential amplifier means continuously connected to the output terminal of each of said first and second amplifier means, first switch means connected from the output terminal of said first amplifier means to the input terminal of said second amplifier means to selectively interconnect said first and second amplifier means, second switch means connected to the input terminal of said first amplifier means to selectively disable said first amplifier means from receiving input signals, and control means connected to said first and second switch means to control the operation thereof.

2. The combination recited in claim 1 wherein said first amplifier means has two input terminals for receiving input signals, said second switch means connected between said two input terminals to selectively short circuit said terminals wherein said first amplifier means receives no input signal.

3. The combination recited in claim 1 wherein said control means causes said first and second switches to be operative simultaneously whereby said first amplifier receives no input signal and produces an error signal and whereby said second amplifier means operates on said error signal produced by said first amplifier means to produce an error-representative signal, said differential amplifier arranged to produce no output signal in response to the concurrent application thereto of said error signal from said first amplifier means and said error representative signal from said second amplifier means.

4. The combination recited in claim 1 wherein said first amplifier means includes a plurality of amplifier circuits connected in cascade.

5. The combination recited in claim 1 wherein each of said first and second switch means includes at least one semiconductor device.

6. The combination recited in claim 1 wherein said differential amplifier includes temperature compensated constant current source means.

7. The combination recited in claim 1 including output means connected to said differential amplifier means, said output means including at least one emitter follower circuit.

* * * * *